United States Patent
Yoshimura et al.

(10) Patent No.: US 6,396,879 B1
(45) Date of Patent: May 28, 2002

(54) TRANSMISSION POWER CONTROLLER AND TRANSMISSION POWER CONTROL METHOD

(75) Inventors: Takehiro Yoshimura; Keisuke Ohmura; Yoshinori Yamashina, all of Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/679,629

(22) Filed: Oct. 5, 2000

Related U.S. Application Data

(63) Continuation of application No. PCT/JP99/00984, filed on Mar. 1, 1999.

(51) Int. Cl.[7] .............................. H04B 1/04; H04B 1/69; H04J 13/00
(52) U.S. Cl. ...................... 375/297; 375/130; 455/115; 455/126
(58) Field of Search ................................ 375/130, 295, 375/296, 297; 455/114, 115, 126

(56) References Cited

U.S. PATENT DOCUMENTS

| | | | | |
|---|---|---|---|---|
| 4,163,940 A | * | 8/1979 | Brewerton | 324/132 |
| 5,553,318 A | * | 9/1996 | Ohmagari et al. | 455/126 |
| 5,594,385 A | * | 1/1997 | Anvari | 330/149 |
| 5,715,526 A | * | 2/1998 | Weaver, Jr. et al. | 455/126 |
| 6,163,399 A | * | 12/2000 | Berg | 359/341 |

FOREIGN PATENT DOCUMENTS

| | | |
|---|---|---|
| JP | 645994 | 2/1994 |
| JP | 730444 | 1/1995 |
| JP | 7336243 | 12/1995 |
| JP | 8102767 | 4/1996 |
| JP | 8149020 | 6/1996 |

* cited by examiner

*Primary Examiner*—Young T. Tse
(74) *Attorney, Agent, or Firm*—Rothwell, Figg, Ernst & Manbeck

(57) ABSTRACT

An attenuation control signal for controlling the power of a transmitted signal is generated as follows: A root-mean-square processor 22, receiving a detected output signal of the transmitted signal from a detector 21, carries out the root-mean-square processing of the detected output signal, and a comparator 8 compares the detected output signal passing through the root-mean-square processing with a reference signal, thereby generating the attenuation control signal.

4 Claims, 4 Drawing Sheets

TRANSMISSION POWER CONTROLLER AND TRANSMISSION POWER CONTROL METHOD

CROSS-REFERENCE TO THE RELATED APPLICATION

This application is a continuation of International Application No. PCT/JP99/00984, whose international filing date is Mar. 1, 1999, the disclosures of which Application are incorporated by reference herein.

TECHNICAL FIELD

The present invention relates to a transmission power controller and a transmission power control method capable of carrying out stable transmission power control independently of the number of the channels to be multiplexed by a modulator in the transmission power control in a CDMA communications system.

BACKGROUND ART

FIG. 5 is a block diagram showing a configuration of a conventional transmission power controller. In FIG. 5, the reference numeral 1 designates a modulator for carrying out spreading and modulation and multiplexing of a plurality of user communication signals CH1–CHn fed from a baseband stage (not shown) in order to spread the spectrum of each narrow band user communication signal to a wide band signal. The communications system is referred to as a CDMA (code division multiple access) system. The reference numeral 2 designates a mixer for mixing a transmitted signal output from the modulator 1 with a signal output from a local oscillator 3; 4 designates a variable attenuator for carrying out attenuation control of the transmitted signal passing through the mixing by the mixer 2 in response to an attenuation control signal slot by slot, for example; 5 designates a power amplifier for amplifying the transmitted signal passing through the attenuation control by the variable attenuator 4 to be output.

The reference numeral 6 designates a detector for capturing the amplified transmitted signal via a coupler 6a at every predetermined time interval, and for detecting it. The reference numeral 7 designates an A/D converter for A/D converting the transmitted signal captured by the detector 6; 8 designates a comparator for comparing the output signal of the A/D converter 7 with a reference signal captured by a reference voltage generator 9, and for outputting the compared result; 9 designates the reference voltage generator for generating the reference voltage from the total transmission power of the user communication signals multiplexed by the modulator 1; and 10 designates a compared result output section for supplying the variable attenuator 4 with the compared result output from the comparator 8.

Next, the operation will be described.

First, the modulator 1 carries out the spreading and modulation of the plurality of user communication signals CH1–CHn fed from the baseband stage, and multiplexes the spread modulated signals. Then, the mixer 2 mixes the transmitted signal supplied from the modulator 1 with the signal supplied from the local oscillator 3, and outputs the mixed signal. Subsequently, the variable attenuator 4 carries out the attenuation control of the transmitted signal passing through the mixing by the mixer 2 in response to the attenuation control signal supplied from the compared result output section 10 slot by slot, for example. The transmitted signal undergone the attenuation control is amplified by the power amplifier 5 to prescribed transmission power, and is radiated from an antenna not shown.

The attenuation control signal is produced by the compared result output section 10 which is supplied with the compared result from the comparator 8 that compares the reference signal generated by the reference voltage generator 9 from the total transmission power information fed from the modulator 1 with a detected voltage signal produced by the detector 6 that detects the transmitted signal it captures via the coupler 6a.

The feedback control of the transmission power signal thus carried out makes it possible to generate a stable transmission power signal independently of aging or variation in the power amplifier 5 or its peripheral components.

In such a conventional automatic power controller (APC), however, the voltage amplitude of the transmitted signal output from the power amplifier 5 varies greatly in accordance with the number of channels to be multiplexed by the modulator 1, thereby resulting in large variations in the detected output signal of the detector 6 even for transmission signals equal in power. Thus, although the modulator 1 produces the transmission power signal equal in power, the actual transmission power stabilized by the APC control varies in response to the number of channels to be multiplexed.

With the foregoing configuration, the conventional transmission power controller has a problem of being unable to carry out accurate power control of the transmitted signal because of the large fluctuations in the detected output signal of the detector 6 in response to the number of channels to be multiplexed by the modulator 1.

The present invention is implemented to solve the foregoing problem. It is therefore an object of the present invention to provide a transmission power controller and a transmission power control method capable of achieving highly accurate transmission power control independently of the number of channels to be multiplexed by the modulator.

DISCLOSURE OF THE INVENTION

According to one aspect of the present invention, there is provided a transmission power controller comprising feedback means for generating an attenuation control signal by comparing a detected output processed signal with a reference signal, the detected output processed signal being produced as a result of the root-mean-square processing of a detected output signal of a transmitted signal captured by detecting means.

This offers an advantage of being able to achieve stable transmission power control independently of the number of channels to be multiplexed by a modulator.

According to another aspect of the present invention, the feedback means can carry out a plurality of times the root-mean-square processing of the detected output signal of the transmitted signal captured by the detecting means, carry out moving average processing of the signal undergone the root-mean-square processing, and generate the attenuation control signal by comparing the signal passing through the moving average processing with the reference signal.

This offers an advantage of being able to achieve stable transmission power control independently of the number of channels to be multiplexed by a modulator.

According to a still another aspect of the present invention, there is provided a transmission power control method of a transmission power controller comprising the step of generating an attenuation control signal by comparing a detected output processed signal with a reference signal, the detected output processed signal being produced as a result of the root-mean-square processing of a detected output signal of a transmitted signal.

This offers an advantage of being able to achieve stable transmission power control independently of the number of channels to be multiplexed by a modulator.

According to anther aspect of the present invention, the transmission power control method of the transmission power controller can carry out the root-mean-square processing of the detected output signal of the transmitted signal, carry out moving average processing of the signal undergone the root-mean-square processing, and generate the attenuation control signal by comparing the signal passing through the moving average processing with the reference signal.

This offers an advantage of being able to achieve stable transmission power control independently of the number of channels to be multiplexed by a modulator.

BEST MODE FOR CARRYING OUT THE INVENTION

The best mode for carrying out the invention will now be described with reference to the accompanying drawings to explain the present invention in more detail.
Embodiment 1

Figure 1:
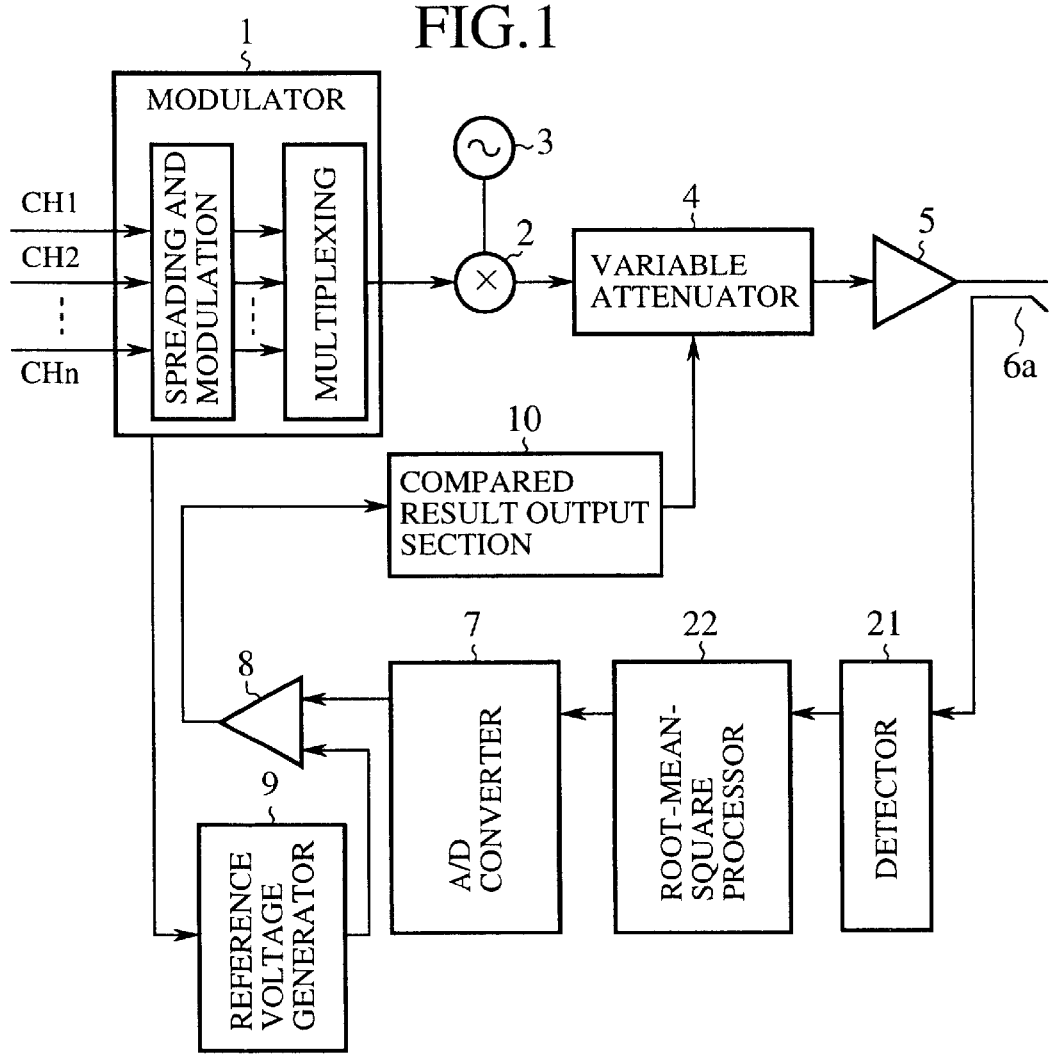
FIG. 1 is a block diagram showing a configuration of an embodiment 1 of the transmission power controller in accordance with the present invention.

FIG. 1 is a block diagram showing a configuration of an embodiment 1 of the transmission power controller in accordance with the present invention. In this figure, the reference numeral 1 designates a modulator (modulation means) for carrying out spreading and modulation and multiplexing of a plurality of user communication signals CH1–CHn fed from a baseband stage (not shown) in order to spread the spectrum of each narrow band user communication signal to a wide band signal; 2 designates a mixer (modulation means) for mixing a transmitted signal output from the modulator 1 with a signal output from a local oscillator 3; 4 designates a variable attenuator (variable attenuation means) for carrying out attenuation control of the power of the transmitted signal passing through the mixing by the mixer 2 in response to an attenuation control signal slot by slot, for example; and 5 designates a power amplifier for amplifying the transmitted signal passing through the attenuation control by the variable attenuator 4 to be output.

Figure 2:
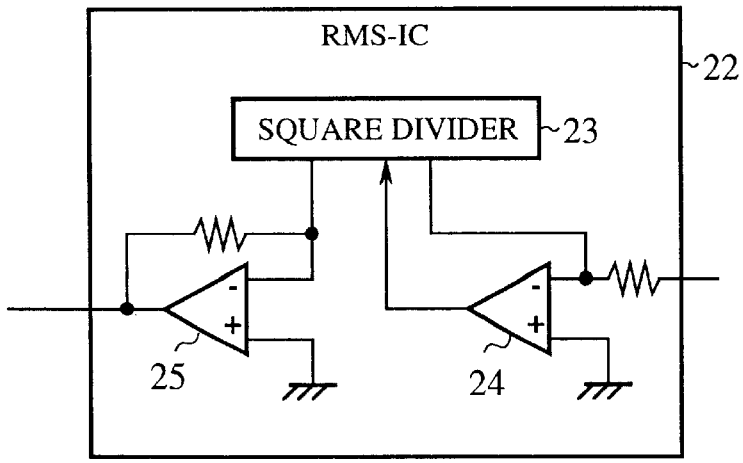
FIG. 2 is a circuit diagram showing a configuration of a root-mean-square processor (RMS-IC) of the embodiment 1 of the transmission power controller in accordance with the present invention.

The reference numeral 21 designates a detector (detecting means) for capturing the amplified transmitted signal via a coupler 6a to detect it. The reference numeral 22 designates a root-mean-square processor (feedback means) for carrying out root-mean-square processing (that is, calculating square root of the arithmetic mean of a plurality of squares of the signal) on the detected output signal from the detector 21 that detects the transmitted signal, and for producing a detected output processed signal passing through the root-mean-square processing, which is implemented by a RMS-IC or the like. As shown in FIG. 2, the root-mean-square processor 22 comprises a square divider 23 and operational amplifiers 24 and 25 connected to the input and output terminals of the square divider 23. The reference numeral 7 designates an A/D converter for A/D converting the resultant signal of the root-mean-square processing by the root-mean-square processor 22; 8 designates a comparator (feedback means) for comparing the output signal from the A/D converter 7 with a reference signal captured by a reference voltage generator 9, and for outputting the compared result; 9 designates the reference voltage generator (feedback means) for generating the reference voltage from the total transmission power of the user communication signals multiplexed by the modulator 1; and 10 designates a compared result output section (feedback means) for supplying the compared result output from the comparator 8 to the variable attenuator 4 as the attenuation control signal.

Next, the operation will be described.

First, the modulator 1 carries out the spreading and modulation of the plurality of user communication signals CH1–CHn fed from the baseband stage, and multiplexes the spread modulated signals into a transmitted signal to be supplied to the mixer 2. Then, the mixer 2 mixes the transmitted signal with the signal supplied from the local oscillator 3, and outputs the mixed signal. Subsequently, the variable attenuator 4 carries out the attenuation control of the transmitted signal passing through the mixing by the mixer 2 in response to the attenuation control signal supplied from the compared result output section 10 slot by slot, for example. The transmitted signal undergone the attenuation control is amplified by the power amplifier 5 to prescribed transmission power, and is radiated from an antenna not shown.

On the other hand, the detector 21 captures the transmitted signal via the coupler 6a at every predetermined time interval, and detects it to obtain a detected output signal. The root-mean-square processor 22 performs the root-mean-square processing on the detected output signal of the transmitted signal captured by the detector 21 in accordance with the following equation (1).

$$y(t) = \sqrt{(1/N)} \sum_{t=0}^{N} (x(t))^2 \qquad (1)$$

where x(t) is the output value of the detector 21, y(t) is the output value of the root-mean-square processor 22 and N is the number of samplings.

Subsequently, the A/D converter 7 A/D converts the detected output processed signal passing through the root-mean-square processing by the root-mean-square processor 22. The comparator 8 compares the output signal of the A/D converter 7 with the reference signal captured by the reference voltage generator 9, and outputs the compared result as the attenuation control signal. The compared result output section 10 supplies the variable attenuator 4 with the attenuation control signal fed from the comparator 8. The variable attenuator 4 varies the power of the transmitted signal in response to the attenuation control signal.

In the CDMA communications system, even when the transmission power is identical, the transmitted waveform amplitude (the voltage amplitude) can vary depending on the number of multiplexing. In view of this, the CDMA communications system in accordance with the present invention carries out the root-mean-square processing of the detected output signal to eliminate the variation in the detected output signal due to the amplitude difference in the transmitted signal.

As described above, the present embodiment 1 generates the attenuation control signal by comparing the detected output processed signal undergone the root-mean-square processing of the output of the detector 21 with the reference signal. This offers an advantage of being able to implement stable transmission power control at high accuracy independently of the number of channels to be multiplexed by the modulator 1.

Embodiment 2

Figure 3:
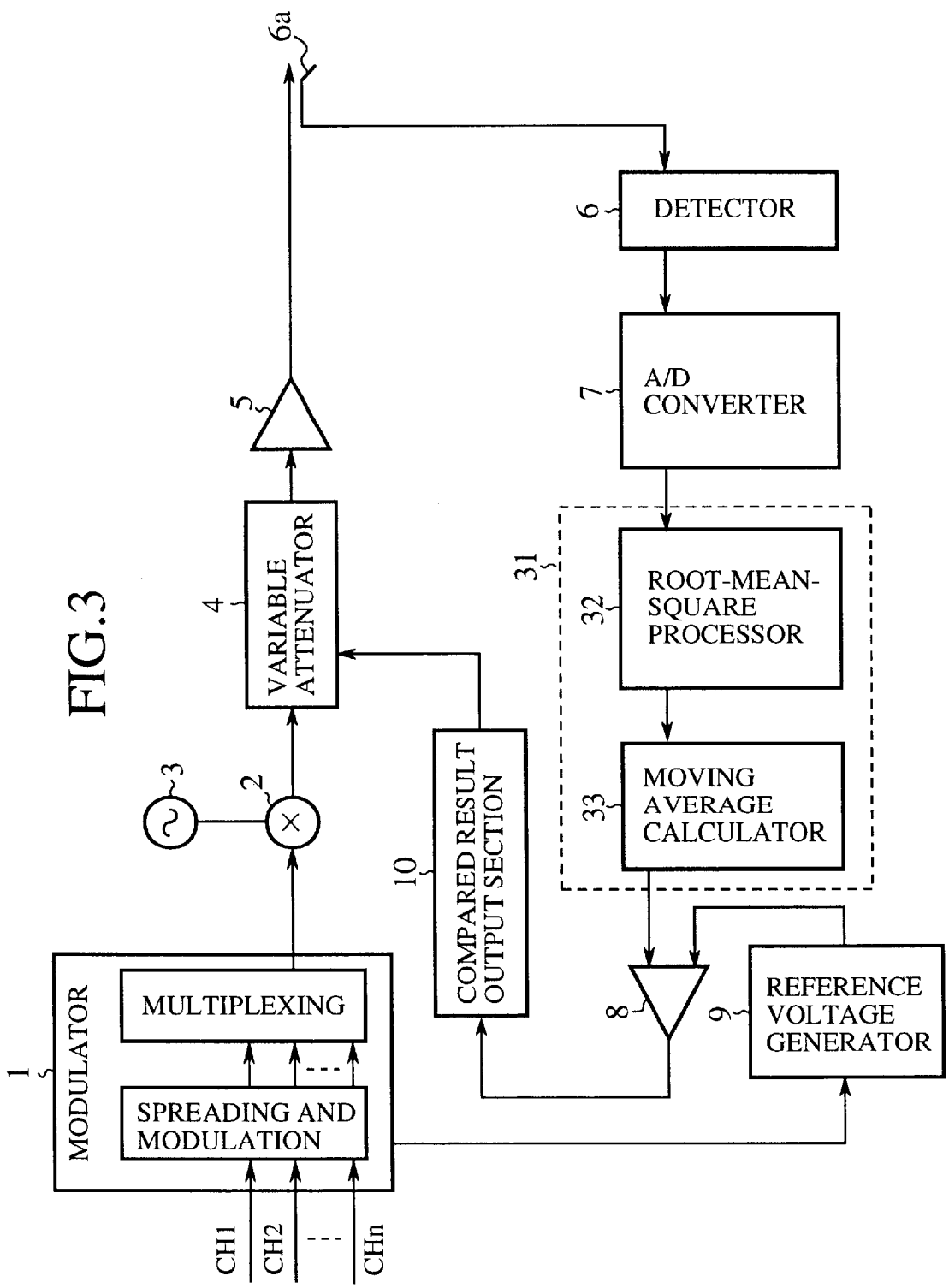
FIG. 3 is a block diagram showing a configuration of an embodiment 2 of the transmission power controller in accordance with the present invention.

FIG. 3 is a block diagram showing a configuration of an embodiment 2 of the transmission power controller in accordance with the present invention. In this figure, the same reference numerals designate the same or like portions to those of the embodiment 1, and the description thereof is omitted here. In the foregoing embodiment 1, the detected output processed signal calculated by the root-mean-square processor 22 is supplied to the comparator 8 via the A/D converter 7. In the present embodiment 2, however, the output of the detector 6 is A/D converted by the A/D converter 7, first, and then the A/D converted detected output signal is supplied to a detection voltage generator 31 to undergo the root-mean-square processing, followed by the moving average processing for several past root-mean-square processing results. Then, the signal passing through the moving average processing is supplied to the comparator 8.

The reference numeral 31 designates the detection voltage generator (feedback means) comprising a root-mean-square processor 32 for performing the root-mean-square processing on the detected output signal of the transmitted signal, and a moving average calculator 33 for averaging several pieces of past bit information output from the root-mean-square processor 32 in accordance with the following equation (2).

$$z(t)=\{y(t)+y(t-1)+ \ldots +y(t-M+1)\}/M \quad (2)$$

where y(t) is the output value of the root-mean-square processor 32, z(t) is the output value of the detection voltage generator 31, and M is the moving average length.

As described above, in the present embodiment 2, the detection voltage generator 31 performs the root-mean-square processing of the detected output signal of the transmitted signal, followed by the moving average processing of the several past root-mean-square processed signals. This offers an advantage of being able to implement the stable transmission power control at high accuracy independently of the number of channels to be multiplexed by the modulator 1.

Embodiment 3

Figure 4:
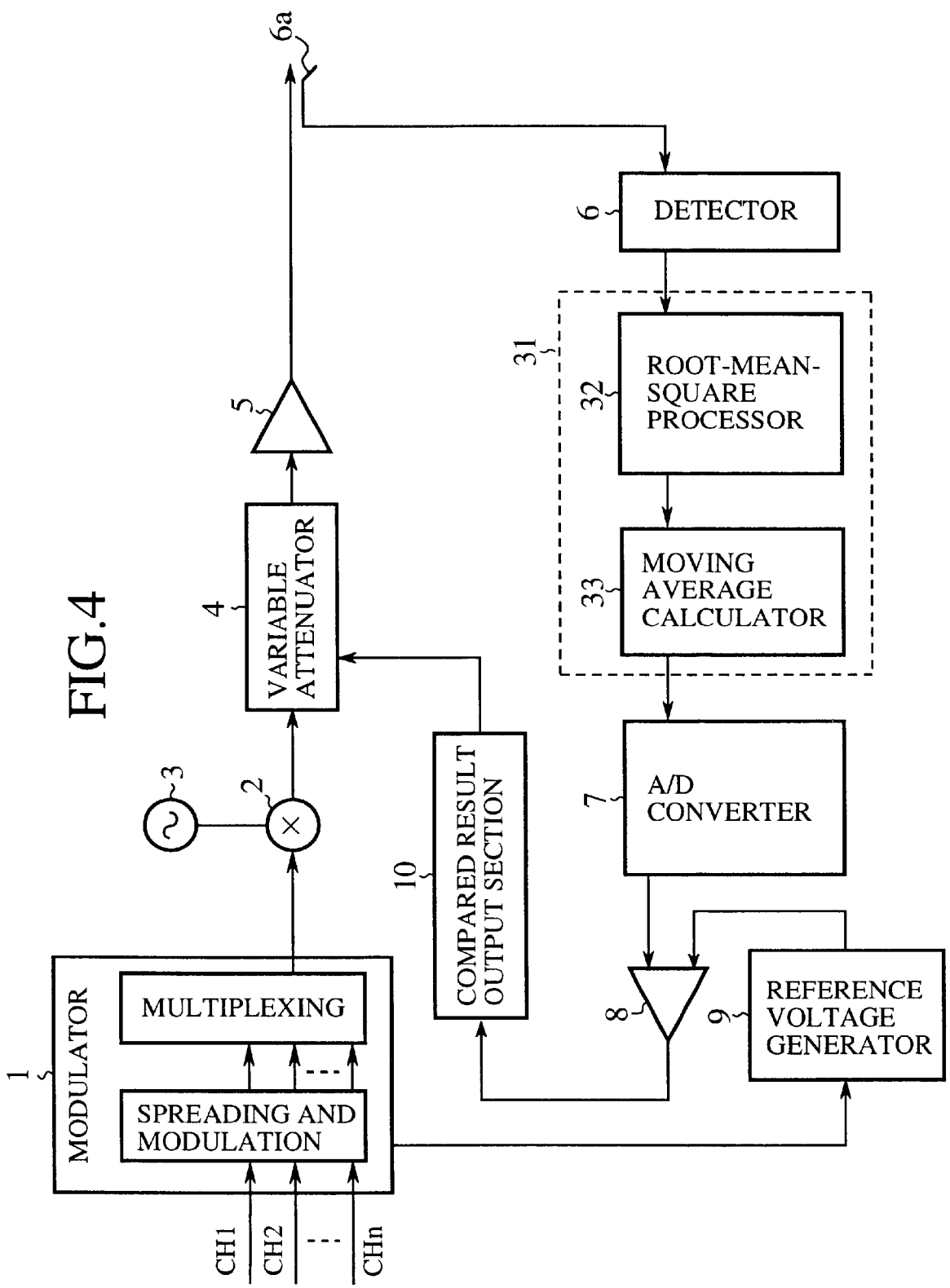
FIG. 4 is a block diagram showing a configuration of an embodiment 3 of the transmission power controller in accordance with the present invention.
Figure 5:
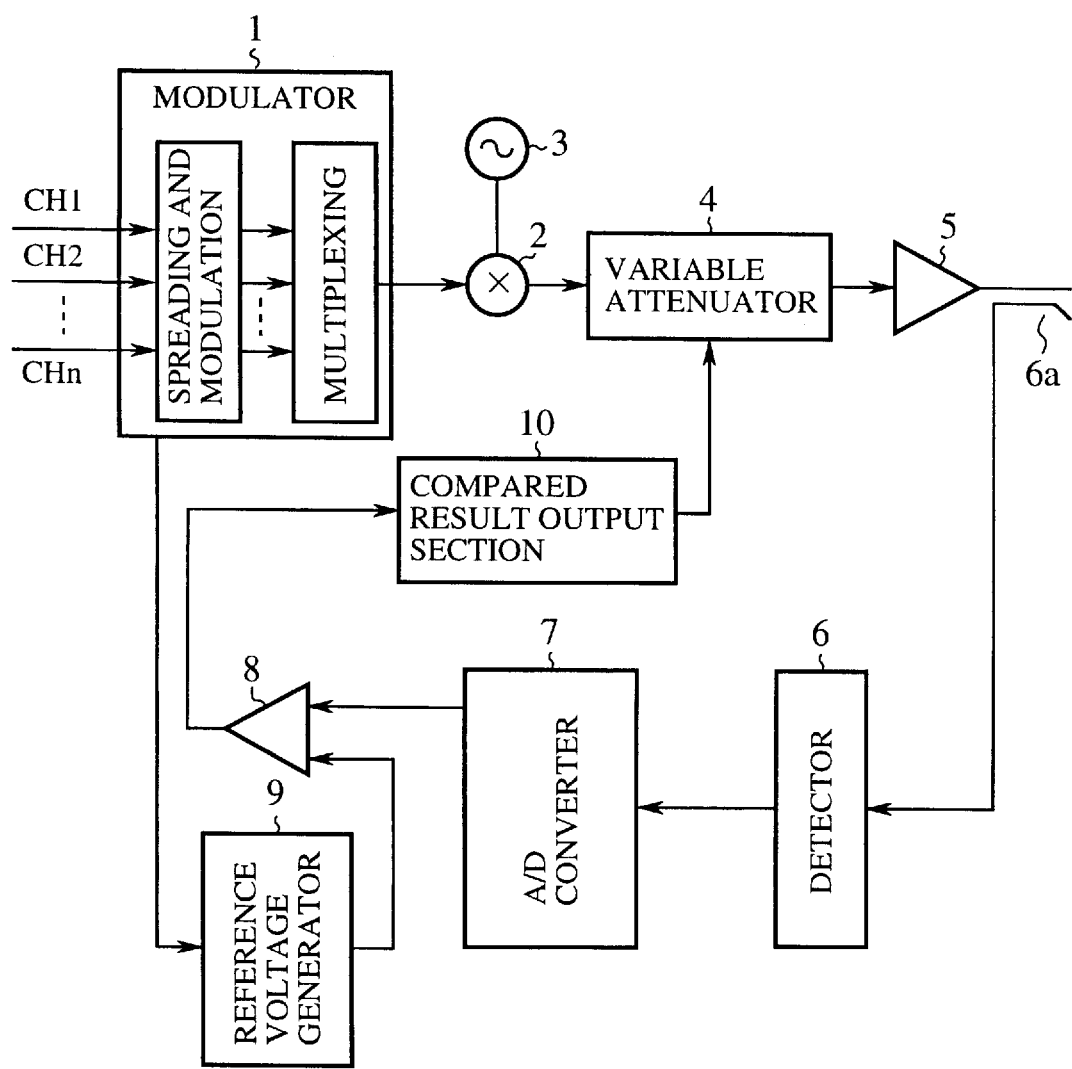
FIG. 5 is a block diagram showing a configuration of a conventional transmission power controller.

FIG. 4 is a block diagram showing a configuration of an embodiment 3 of the transmission power controller in accordance with the present invention. In this figure, the same reference numerals designate the same or like portions to those of the foregoing embodiments 1 and 2, and the description thereof is omitted here. Although the detection voltage generator 31 processes the A/D converted detected output signal in the foregoing embodiment 2, the detection voltage generator 31 in the present embodiment 3, which comprises the root-mean-square processor 32 and the moving average calculator 33, processes the detected output signal of the transmitted signal detected by the detector 6, followed by the A/D conversion by the A/D converter 7. The present embodiment 3 can achieve the same advantage as that of the foregoing embodiment 2.

INDUSTRIAL APPLICABILITY

As described above, the transmission power controller and transmission power control method in accordance with the present invention can implement stable transmission power control at high accuracy independently of the number of channels to be multiplexed by the modulator in the transmitting stage of the CDMA communications system.

What is claimed is:

1. A transmission power controller comprising:
   modulating means for carrying out spreading, modulation and multiplexing of a plurality of input user communication signals, and providing an output multiplexed signal of spread and modulated user communication signals;
   variable attenuation means for performing power control of said multiplexed signal output from said modulating means in response to an attenuation control signal to produce a transmitted signal;
   amplifying means for amplifying the transmitted signal output from the variable attenuation means to produce an amplified signal;
   detecting means for detecting the amplified signal output from said amplifying means to produce a detected output signal; and
   feedback means for generating said attenuation control signal by comparing said detected output signal of said detecting means with a reference signal having a reference voltage from the total transmission power of the user communication signals, and for supplying said attenuation control signal to said variable attenuation means,
   wherein said feedback means performs root-mean-square processing of said detected output signal and generates said attenuation control signal by comparing with said reference signal a detected output processed signal produced as a result of the root-mean-square processing.

2. The transmission power controller according to claim 1, wherein said feedback means carries out the root-mean-square processing a plurality of times to produce a plurality of detected output processed signals, carries out moving average processing of the plurality of detected output processed signals to produce a moving average processed signal, and generates said attenuation control signal by comparing the moving average processed signal with the reference signal.

3. A transmission power control method comprising the steps of:
   carrying out spreading, modulation and multiplexing of a plurality of user communication signals and providing an output multiplexed signal of spread and modulated user communication signals;
   carrying out, in response to an attenuation control signal, power control of said output multiplexed signal to produce an attenuated signal;
   amplifying the attenuated signal to produce an amplified signal as a transmission signal;
   detecting said transmission signal to produce a detected output signal; and
   generating the attenuation control signal by comparing said detected output signal with a reference signal having a reference voltage from the total transmission power of the user communication signal, wherein the step of generating the attenuation control signal includes the step of performing root-mean-square processing of said detected output signal to produce a detected output processed signal, and comparing said detected output processed signal with the reference signal.

4. The transmission power control method according to claim 3, wherein said attenuation control signal is generated through the steps of:

carrying out said root-mean-square processing a plurality of times to produce a plurality of detected output processed signals;

carrying out moving average processing of said plurality of detected output processed signals to produce a moving average processed signal; and comparing said moving average processed signal with the reference signal.

* * * * *